United States Patent [19]

Douglass

[11] 4,242,611

[45] Dec. 30, 1980

[54] METHODS AND APPARATUS FOR PROVIDING ULTRA-STABLE FREQUENCY STANDARDS AND CLOCKS

[75] Inventor: David H. Douglass, Rochester, N.Y.

[73] Assignee: The University of Rochester, Rochester, N.Y.

[21] Appl. No.: 799,800

[22] Filed: May 23, 1977

[51] Int. Cl.[3] .................... H01L 41/00

[52] U.S. Cl. .................... 310/344; 310/311; 310/318; 368/159

[58] Field of Search .................... 310/311, 322, 360–362, 310/348, 351, 352, 354; 58/23 V, 23 AC, 23 TF, 23 D; 331/116 M, 107, 154, 155, 158

[56] References Cited

U.S. PATENT DOCUMENTS

| | | | |
|---|---|---|---|
| 1,823,329 | 9/1931 | Marrison | 310/361 |
| 2,176,653 | 10/1939 | Bokovoy | 310/361 |
| 2,925,502 | 2/1960 | Franx | 310/361 X |
| 3,258,617 | 6/1966 | Hart | 310/361 X |
| 3,353,400 | 11/1967 | Schafft | 310/322 X |

OTHER PUBLICATIONS

*Quartz Oscillators and Their Applications*, by P. Vigoureux, 1939, Chapters VII, VIII and X. (pp. 73–95, 100–113).

*Primary Examiner*—Mark O. Budd
*Attorney, Agent, or Firm*—Martin Lu Kacher

[57] ABSTRACT

Improved clocks and frequency standards are provided through the use of single crystals having a mass of the order of kilograms maintained at temperatures of the orders of few degrees Kelvin which are caused to vibrate freely at low modes of resonant vibration. The frequency stability of such vibrations is ultra-stable over long periods of time and provide frequency standards and clocks having stability orders of magnitude greater than clocks and standards based upon quartz crystal oscillators and equal or better than standards and clocks based upon atomic beams (cesium, rubidium and hydrogen masers).

40 Claims, 10 Drawing Figures

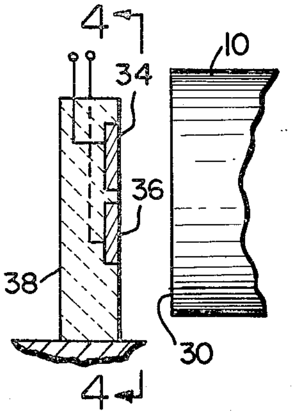
FIG. 3
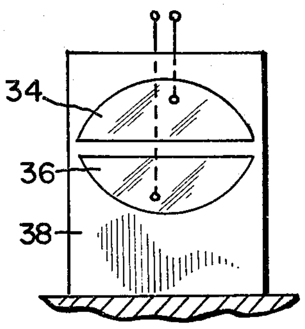
FIG. 4
FIG. 5
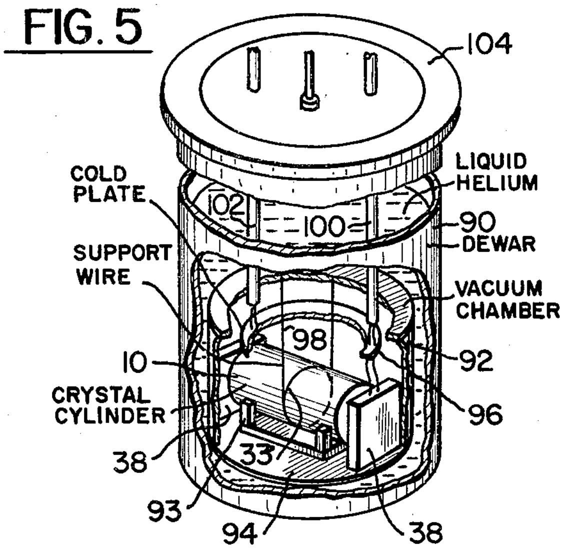
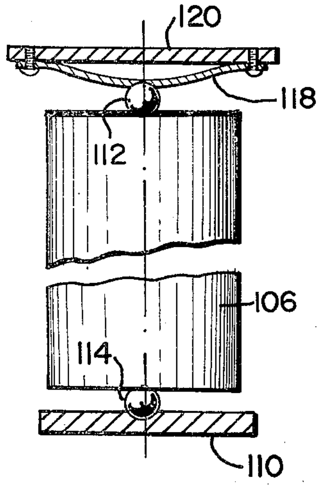
FIG. 7
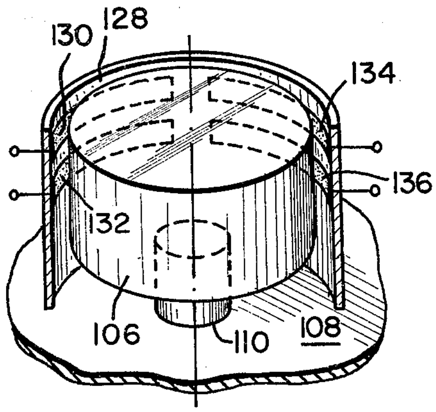
FIG. 6
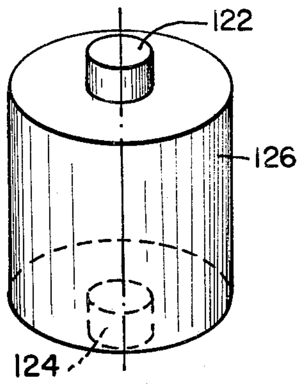
FIG. 8
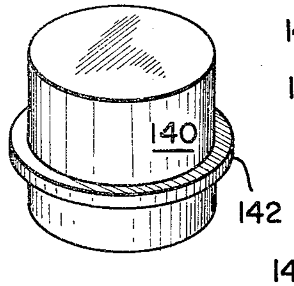
FIG. 9
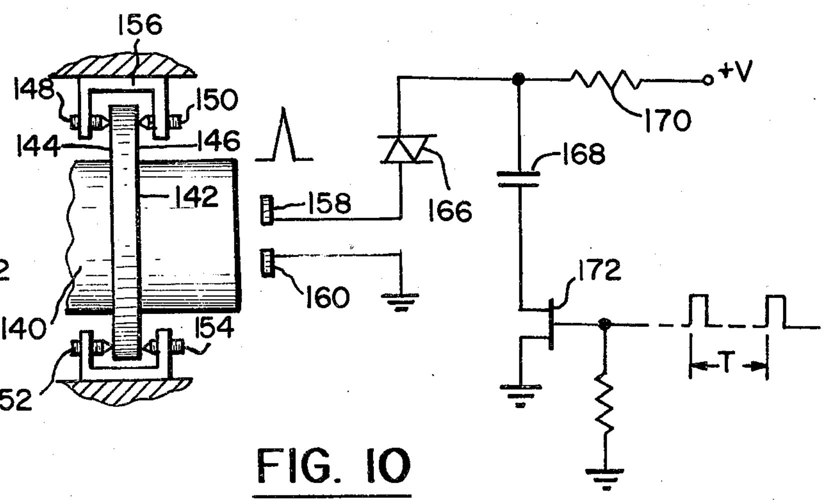
FIG. 10

METHODS AND APPARATUS FOR PROVIDING ULTRA-STABLE FREQUENCY STANDARDS AND CLOCKS

The present invention relates to methods and apparatus for providing improved frequency standards and clocks and particularly to methods and apparatus for providing frequency standards and clocks through the use of mechanical resonators having frequency stability equal to or exceeding the stability of so-called atomic clocks which rely on atomic resonance effects in cesium, rubidium and in hydrogen masers.

The invention is especially suitable for use in the precise measurement of time as may be necessary in primary frequency standards or clocks and for navigational or guidance purposes. It is a principal aim of the invention to provide such frequency standards and clocks which have high reliability and at low cost as compared to the cost of frequency standards and clocks based upon atomic beams.

Atomic beam clocks and standards which have been produced are ultra-stable in frequency. The most stable and most expensive of these clocks is the hydrogen maser clock which has a frequency stability ($\Delta f/f$) of the order of $10^{-14}$ for integration times exceeding $10^2$ seconds. Secondary standards have been provided which utilize a quartz crystal operating in the piezoelectric mode. The frequency stability of the piezoelectric quartz standard clock is of the order of $10^{-11}$ for integration times exceeding one second. Heretofore there have been no known methods or means whereby the stability of the atomic beam clocks could be obtained, excepting of course by means of astronomical observations. Certainly, stabilities of the orders obtained through atomic beams through the use of mechanical elements has not been contemplated as being feasible for obtaining frequency stabilities even approaching stabilities of standards and clocks based upon atomic beams (using cesium and rubidium decay and in hydrogen masers).

It has been discovered, in accordance with the invention, that certain materials which are in the form of single crystals of mass of the order of kilograms when maintained at temperatures of the order of a few degrees Kelvin may be excited to vibrate as mechanical resonators and may be used to provide frequency standards and clocks having stabilities, orders of magnitude greater than those based upon crystals made of quartz operating in the piezoelectric mode and equal or exceeding those based on atomic beams. The single crystal material may be silicon or sapphire single crystals of high purity fabricated by crystal growing techniques known in the art. It is critical to the attainment of ultra-stable frequency standards and clocks in accordance with the invention that the single crystals be operative to have a high mechanical quality factor, Q, and particularly that the crystals be supported so that their quality factor Q is not adversely affected. This follows from the relationship between the variance frequency deviation of any oscillator $\sigma^2(\tau)$ which is approximately equal to $kT/4PQ^2\tau$, where T is the temperature, P is power, and $\tau$ is the integration time. Single crystals of silicon or sapphire ($Al_2O_3$) have quality factors or Q of the order of $10^9$ when in the form of bodies of the order of a few kilograms in mass and when maintained at temperatures of the order of a few degrees Kelvin. The Q's of atomic clocks, particularly hydrogen maser clocks, are of the order of $10^9$. The theoretical maximum Q of single crystal mechanical resonators is of the order of $10^{18}$. It has been found impirically that frequency stability is related to Q by the relationship, $\Delta f/f \sim A/Q$, where A is approximately equal to $10^{-5}$. Accordingly, the stability of frequency standards and clocks based upon single crystal mechanical resonators, as may be provided in accordance with the invention, are several orders of magnitude more stable than standard piezoelectric quartz clocks and stabilities which equal and can exceed the stabilities of atomic clocks are obtainable.

By virtue of their extremely high Q at resonance, the invention enables frequency standards and clocks to be provided which needs only to be excited intermittently, say at periods separated by days or even weeks. Relaxation time of the single crystal resonators operated as frequency standards and clocks in accordance with the invention are related to Q by $\tau_r = 1Q/1\pi f_r$ where $\tau_r$ is the relaxation time and $f_r$ is the frequency of resonant vibration of the single crystal body. Single crystal bodies have Q's equal or exceeding $10^9$ and are resonant at frequencies of the order of $10^4$ Hz. Accordingly, the relaxation times can approach weeks and can even be years. Frequency standards and clocks provided in accordance with the invention need only be excited for periods of time which are extremely short, say by a burst of mechanical oscillations or by a force impulse and provide, for a long period of time, output signals the frequency of which is ultra-stable.

While single crystals having high Q's have been described in the literature (see Bagdasarov, et al, Sov. Phys. Crystallogr., Vol. 19, No. 4, Jan.-Feb. 1975, 549) such crystals have been used in gravitational radiation or wave experiments for the purpose of attempting to detect and measure gravitational radiation, and their use in providing frequency standards or clocks has not been contemplated. Suggestions respecting quartz crystals operating in the piezoelectric mode as high Q oscillators (Q's of $10^9$ have been claimed) are described by a Russian author (see Pribory i Tekhnika E'ksperimenta, No. 6, pp. 157–159, November-December 1975, Translated by Plenum Publishing Corp., 227 West 17th Street, New York, New York 10011, 1976, and Smagin, Cryogenics, p. 483, Aug. 1975).

Accordingly, it is an object of the invention to provide improved clocks and frequency standards and methods whereby such clocks and frequency standards may be provided which makes use of large single crystals of silicon and sapphire as mechanical resonators which output signals of high frequency stability when excited into vibration at low temperatures.

It is another object of the present invention to provide improved clocks and frequency standards and methods whereby signals may be generated for use as frequency standards and clocks which provide improvements in variance of frequency exceeding nine orders of magnitude as compared to clocks and standards using quartz crystal oscillators.

It is a still further object of the present invention to provide improved clocks and frequency standards and methods of providing same through the use of frequency determining elements which require only infrequent excitation say days apart and yet maintain high frequency stability.

It is a still further object of the present invention to provide improved methods and apparatus whereby frequency standards and clocks which have frequency stability comparable to or exceeding the stability of atomic beam clocks such as hydrogen maser clocks and standards may be provided, but without the complexity of such atomic beam and hydrogen maser clocks and standards.

It is a still further object of the present invention to provide improved methods and apparatus for providing clocks and frequency standards wherein driving circuitry, which may be a source of noise and can adversely affect stability, need not be continuously operated, thus enabling ultra high stability to be obtained.

Briefly described, improved clocks and frequency standards which embody the invention make the use of single crystal cylinders having a mass of the order of kilograms and which are maintained at temperatures of the order of a few degrees Kelvin. These cystals have a high mechanical quality factor Q of the order of $10^9$ or more at frequences which are highly stable for long periods of time. The vibration of the crystals is translated into signals the frequency of which may be used as a standard or read out in units of time. Means are provided for supporting the crystals in a manner to maintain their high intrinsic Q as by suspending them at points which are nodes of their vibration. The crystals are also excited and the vibrations derived therefrom by electromechanical transducers which are spaced out of contact with the crystals. The vibrational modes into which the crystals are excited are extensional modes, free of flexure which might degrade their intrinsic Q. Excitation may be provided infrequently. A plurality of crystals may be used which are excited in sequence such that when the vibration of one crystal decays the next is excited.

The foregoing and other objects, advantages and features of the invention as well as preferred embodiments and modes of practicing the invention will be more apparent from a reading of the following description in connection with the accompanying drawings in which FIG. 1 is a block diagram of a frequency standard and clock system using impulse actuated high Q single crystal mechanical resonators in accordance with the invention;

FIG. 3 is a sectional view diagrammatically showing one end of the crystal resonator and vibration pick-up structure of the type illustrated in FIG. 2;

FIG. 4 is a sectional view of the pick-up structure shown in FIG. 3 taken along the line 4—4 in FIG. 3;

FIG. 5 is a perspective view partially in section of a cryostat in which a crystal resonator and other components of a frequency standard or clock system embodying the invention may be supported;

FIG. 6 is a diagrammatic perspective view of a disc crystal mounting structure using a pedestal and showing the mounting for transducers for exciting and detecting vibration of the disc crystal;

FIG. 7 is a diagrammatic elevational view showing a crystal mounting structure utilizing ball bearings;

FIGS. 8 or 9 are persepctive views showing other forms of crystal resonator elements which may be used in accordance with the invention; and FIG. 10 is a diagrammatic view of a mounting structure for a crystal cylinder of the type shown in FIG. 9 which also shows circuit means for providing mechanical force impulses for exciting the crystal into resonant vibration.

Figure 1:
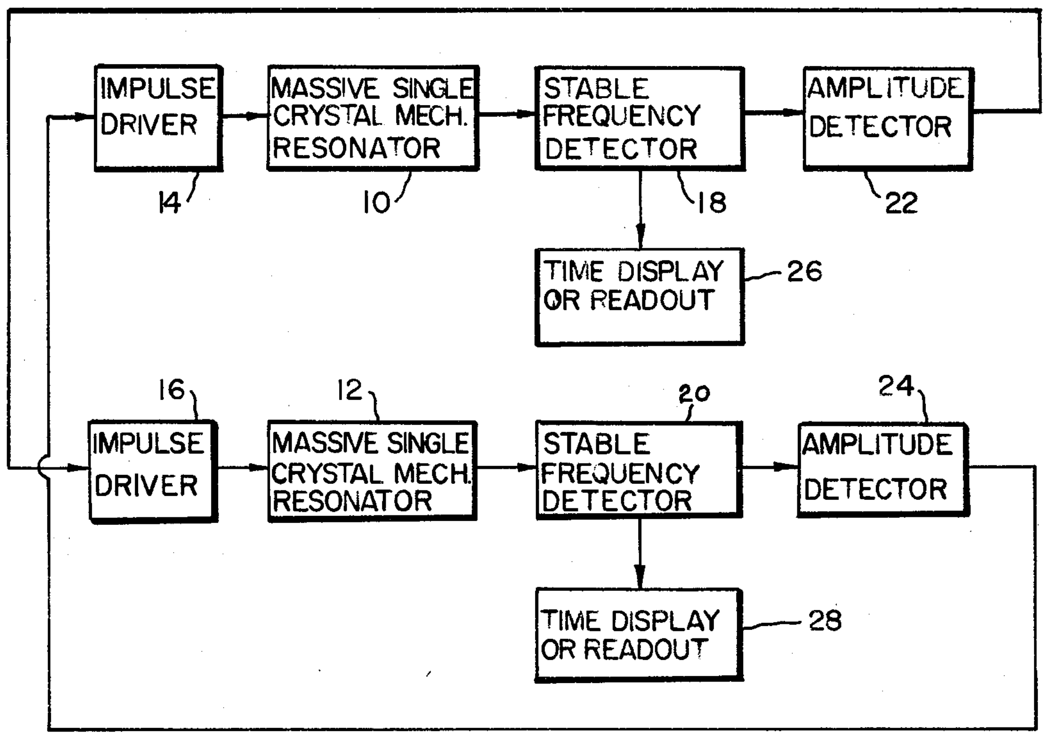

Referring more particularly to FIG. 1, there is shown a system utilizing a plurality of single crystal high Q bodies which are excited successively into vibration as mechanical resonators. Two such single crystal bodies 10 and 12, which are excited alternately are used. This system takes advantage of the long period of decay of the ultra-frequency stable vibrations of an excited single crystal body. Each of the bodies 10 and 12 is supported for free oscillation in a non-flexural mechanical mode, desirably the lowest or first mode of vibration. The extensional modes are presently preferred. The methods and apparatus for supporting the single crystal bodies 10 and 12 are described in greater detail hereinafter. The single crystal bodies are excited into vibration, so that they function as mechanical resonators, by impulse drivers 14 and 16. These drivers may use electromechanical transducers which are responsive to electrical signals in the form of force impulses which are applied to the single crystal bodies 10 and 12 without the transducers contacting the bodies. The duration of the excitation is extremely short as compared to the decay time of the resonators 10 and 12 (e.g., milliseconds as compared to days). The design of suitable impulse drivers is discussed hereinafter in connection with FIGS. 2 and 10.

The vibrations from the mechanical resonators 10 and 12 are picked up and detected by frequency detectors 18 and 20. They are termed stable frequency detectors inasmuch as the signals corresponding to the vibration of the resonators 10 and 12 are extremely stable in frequency (e.g., of the order of $10^{-14}$ for integration times exceedng $10^2$ seconds which is comparable to hydrogen maser frequency standards). The pick-up of transducers of the frequency detectors may be electromechanical transducers which are disposed out of contact with the single crystal bodies as they vibrate as mechanical resonators 10 and 12. By virtue of the support for the single crystal bodies and the out of contact relationship of the drivers 14 and 16 and the detectors 18 and 20 with cooperate therewith, the intrinsically high Q of the bodies is maintained to the end that the frequency stability of the vibrations thereof and the signals corresponding to these vibrations is maintained.

In order to excite the single crystal bodies into resonance alternately so that one or the other of the bodies is vibrating and strong output signals are produced by the frequency detectors, amplitude detectors 22 and 24 are provided. These amplitude detectors may be envelope detectors which provide direct current signals following the peaks of the signals from the frequency detectors 18 and 20. The output of the amplitude detectors may be applied to threshold circuits contained in the impulse drivers 14 and 16 such that when the amplitude of the envelope drops to one tenth its maximum amplitude, the maximum amplitude will be the amplitude obtained immediately after the operation of the impulse driver to excite the single crystal body, the driver will again operate to excite the body.

The amplitude detector 22 which responds to the amplitude of the vibratiions of a first of the resonators 10 is connected to the impulse driver 16 for a second of the resonators 12. Similarly the amplitude detector 24 which is responsive to the amplitude of vibration of the second resonator 12 is connected to the impulse driver 14 for the first resonator 10. When the amplitude of vibration of the first resonator 10 drops below the predetermined amplitude, the impulse driver 16 for the second resonator 12 is excited. When the vibrations of the second resonator 12 drop below the predetermined amplitude, this condition is detected by the amplitude detector 24 and the impulse driver 14 for the first resonator 10 is excited. Accordingly, the resonators 10 and 12 are excited alternately and a stable frequency output signal is provided at all times from at least one of them. In order to provide in-phase vibrations of both resonators 10 and 12, a phase comparison of the signals from each of them may be made immediately after excitation, and force impulses repeated until in-phase vibrations are detected.

When vibrating as mechanical resonators 10 and 12, the single crystal bodies provide output signals having a frequency which is equal to the frequency of resonant vibrations of the single crystal in the vibrational mode in which it is supported for vibration. This frequency is determined by the material of the signal crystal body and its size. For single crystals of silicon and sapphire ($Al_2O_3$) having a mass of the order of kilograms and at a temperature of a few degrees Kelvin which are supported in a first or lowest extensional mode of vibration, the frequency of the vibrations is of the order of $10^4$ Hz (e.g., about 20 KHz, or about 30 KHz). The single crystals used in the resonators 10 and 12 are suitably sized and polished and supported so that their output frequency is substantially identical. However, exact identity of the output signals is not required inasmuch as the frequency detectors 18 and 20 may include counters having different dividing ratios so as to normalize the frequency of the output signals.

Displays 26 and 28 are associated with the frequency detectors 18 and 20 respectively. These displays may read out a frequency from the counters in the detectors. When the counters divide by the resonant frequency of the resonators 10 and 12, $f_o$, the display may be in time units, such as seconds, minutes and hours. The displays may be alphanumeric digital displays such as including light emitting diodes of the type known in the art. When the display reads out units of time the system is operated as a clock. When frequency readout is obtained the system is operated as a frequency standard. Although two time display or frequency readout units 26 and 28 are shown, only a single display unit may be used, and the output of the frequency detector 18 or 20 from the resonator 10 or 12 which does not produce vibrations above the predetermined amplitude, is inhibited. Alternatively, two displays may be used as shown and the display associated with the resonator the vibration amplitude of which has dropped below the predetermined amplitude, may itself be inhibited. Outputs from the amplitude detectors 22 and 24 may be used to inhibit the detector outputs or the displays in accordance with conventional logic circuit techniques.

Figure 2:
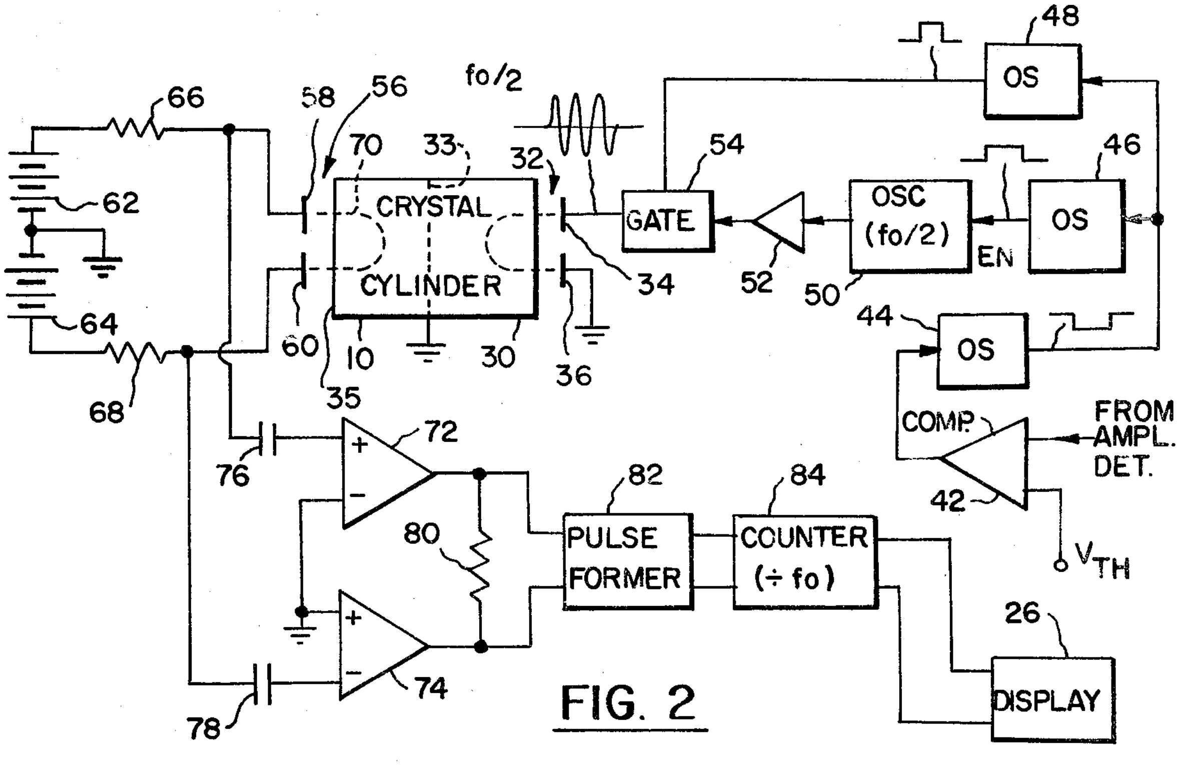
FIG. 2 is a circuit diagram, partially in block form of a portion of the system shown in FIG. 1.

FIG. 2 shows one of the single crystal bodies 10 and its associated impulse driver 14 and frequency detector 18. The single crystal 10 is in the form of a cylinder which is supported to vibrate in its longitudinal mode. The node of vibration is about the mid-point of the cylinder (viz., about a circle which encompasses the cylinder at the mid-point between its opposite ends 30 and 35. This circle is shown by the dash line 33. In the longitudinal mode of vibration, the cylinder extends and contracts along its longitudinal axis. The longitudinal mode of vibration is therefore an extensional mode. When supported at a node of this vibration, the vibration is not affected as by being damped. It is critical to the provision of mechanical resonators having high Q's (viz, $10^9$ and higher) that flexural vibration be avoided. Flexural vibration is analogous to the vibration of a violin string and it is the mode of vibration of piezoelectric quartz crystals which are commonly used in quartz clocks and frequency standards. Through the use of extensional modes of vibration of the single crystal bodies provided in accordance with the invention, high Q's are obtained and the ultra-high frequency stability provided by the invention achieved.

Other extensional modes such as higher modes than the first longitudinal mode of vibration may be used. However, the lowest extensional modes, either the first longitudinal mode or the quadruple mode, are presently preferred.

The crystal cylinder 10 is maintained at low temperatures of the order of a few degrees Kelvin through the use of cryogenic techniques as will be discussed hereinafter in connection with FIG. 5. The cylinder 10 may be grounded as through the member which supports the cylinder. However, such grounding is not critical inasmuch as the material (silicon or sapphire for example) of which the cylinder is composed, is a dielectric at the low temperatures at which it is maintained during operation.

When excited as by a mechanical impulse, the crystal cylinder 10 vibrates at a frequency where it is mechanically resonant in the first longitudinal mode. By way of example, a single crystal of silicon having a length of 22.9 centimeters, the diameter of 10.6 centimeters, and a mass of 4.9 kg, when supported at a vibration node along the circle 33 and maintained at a temperature of approximately 3.5 Kelvin, has a Q of approximately $2\times10^9$ and a resonant frequency of 19,500 Hz.

The impulse driver 14 which excites the single crystals into vibration as a mechanical resonator may be provided by an electromechanical transducer 32 in the form of a pair of electrodes 34 and 36 which are disposed adjacent to one end 30 of the crystal cylinder 10. The electrode configuration is shown in greater detail in FIGS. 3 and 4. An upright member 38 of insulating material is stationed facing the end 30 of the crystal 10. This end 30 may be ground and polished by techniques used for grinding and polishing lenses so that the surfaces presented by the electrodes 34 and 36 and the end 30 of the crystal 10 are suitably spaced, say approximately a fixed distance, from each other. The electrodes 34 and 36 are semi-circular in shape. One of the electrodes is grounded while the other is connected to a source which provides a burst of oscillatons at a frequency approximately equal to one-half the resonant frequency of the crystal 10, ($f_o/2$).

The gaps spacing the electrodes 34 and 36 from the surface of the end 30 and a path through the crystal indicated by the dash lines 40 provide the dielectric of an electrostatic transducer. Since the electrodes 34 and 36 are fixed in the upright support 38, movement of the dielectric occurs. The dielectric is the gap and also the end portion of the crystal 10. The crystal therefore moves in response to the electrostatic forces due to the potentials applied between the electrodes 34 and 36. This potential is shown as an oscillating potential in the form of a burst. The burst is of sufficient length, of several periods, say several milliseconds. Forces then applied to the crystal gradually build up the vibrations of the crystal. After the potential terminates (after the end of the burst) the crystal continues to vibrate (viz, rings or resonates) at its resonant frequency $f_o$. The frequency of the driving potential is $f_o/2$ inasmuch as forces of attraction are produced on both the positive and negative execursions of the exciting potential. While a burst of oscillations is preferred, the exciting oscillations may be applied continuously. In such case they may be of lower amplitude than is the case in a burst, since all that is required is to make up the small losses accompanying the resonant vibration of the crystal 10.

In the impulse driver the burst may be generated in response to a signal from the amplitude detector 22. The signal is applied to a comparator 42 which also receives a threshold voltage $V_{TH}$. The threshold is set to correspond to the amplitude of vibrations of the crystal 12 dropping below the predetermined level, say one-tenth maximum amplitude. The comparator 42 then outputs a transition which excites a one-shot multivibrator 44. Another one-shot multivibrator 46 is triggered by the leading edge of the pulse from the one shot 44 while a second one-shot multivibrator 48 may be triggered by the grounding edge of the pulse from the one shot 44. The duration of the output pulse from the one shot 46 is longer than, and coincides in part with, the pulse from the one shot 48. An oscillator 50 which produces oscillations at the frequency $f_o/2$ is enabled by the pulse from the one shot 46. The oscillator output may be amplified in an amplifier 52 and applied to a gate 54. The pulse from the other one shot 48 enables the gate to pass the burst of oscillations to the electrode 34. The electromechanical transducer 32 is then actuated and the crystal excited into vibration at its resonant frequency.

The frequency detector 18 associated with the opposite end 35 of the crystal includes an electromechanical transducer 56 similar to the transducer 32. This transducer has a pair of electrodes 58 and 60 which may be mounted in a support member similar to the support member 38 in the manner shown in FIGS. 3 and 4. The electrodes 58 and 60 have applied thereto direct current voltages from batteries 52 and 64 which are in balanced relationship with respect to ground. The voltages are applied by way of resistors 66 and 68 of equal value. As the crystal 10 vibrates, the gap between the electrodes 58 and 60 varies at the frequency of vibration of the crystal. This varies the dielectric in the path between the electrodes 58 and 60 which is provided partially by the gap and partially through the crystal and is indicated by the dash line 70. The voltage across the resistors 66 and 68 is modulated in accordance with this vibration. This modulation is coupled to a balanced set of operational amplifiers 72 and 74 via capacitors 76 and 78. The resulting voltage appears across an output resistor 80 connected across the outputs of the amplifiers 72 and 74. The amplifiers 72 and 74 may include feedback circuits for stability and common mode noise rejection. These circuits are not shown to simplify the illustration.

The signal appearing across the resistor 80 is an alternating current signal at the resonant frequency $f_o$. This signal may be translated into pulses having the repetition rate $f_o$ by a pulse former circuit 82. The pulses are then applied to a counter 84. When a read out in time units is required the counter may divide by $f_o$. The counter may be a binary coded decimal counter, the output of which is connected to the display 26 so as to display the units of time in seconds, minutes and hours. Alternatively, the output frequency $f_o$ may be directly displayed, or the signal may be used as a frequency standard in other systems, such as navigation and guidance systems of the type discussed above.

The crystal 10 together with the support 38 which maintains the electrode assemblies adjacent to the opposite ends of the crystal cylinder are held at a temperature of the order of a few degrees Kelvin by means of a cryostat such as shown in FIG. 5. The cryostat is a dewar 90 which may be filled with liquid helium. Inside of this dewar is a vacuum chamber 92 which may be held on supports (not shown) extending to the bottom of the dewar. The base 94 of the vacuum chamber provides a support for the electrode assemblies 38. Within the vacuum chamber is a cold plate 96 from which extends a strand in the form of a support wire 98. The wire 98 is positioned around the center (viz, along the central circle 33) at which is the node of the first and other odd longitudinal modes of vibration of the crystal 10. The crystal 10 is therefore balanced as held in suspension by the wire 98. A cradle 93 locates the crystal 10 with respect to the wire so that the wire will engage and suspend the crystal at the precise point. Other means for support of the crystal 10 may be used which preferably support the crystal at a vibrational node. Examples of such other means of support are discussed hereinafter. Connections through the electrodes of the driver and detector are brought out of the dewar through cables 100 and 102. Connections may also be provided to temperature sensors for monitoring the temperature within the vacuum chamber where the crystal is suspended. Also channels for evacuating the vacuum chamber 92 and for filling and emptying the dewar with liquid helium are also provided. To simplify the drawing, only one of these channels is shown at the sealing cap 104 of the dewar 90. The temperature at which the crystal 10 is maintained may suitably be about 4.2 Kelvin. Evacuation of the chamber in which the crystal 10 is supported is also desirable in the interest of reducing any damping effects due to residual gases.

FIG. 6 illustrates other means for supporting a single crystal body 106 and also the electrode structure of driving and detector transducers. The crystal body 106 is desirably shorter and of larger diameter than the body used in the embodiment shown in FIGS. 2 and 5. The body 106 is more disc-like in shape. A suitable single crystal body may be a sapphire disc which may by way of example have the diameter of 15.1 centimeters, a thickness of 6.6 centimeters and a mass of 5.6 kg. This disc is supported on a base plate 108 upon a pedestal 110. The pedestal is a short, stub cylinder, the longitudinal axis of which is colinear with the axis of the crystal 106.

Another means for supporting the crystal 106 is shown in FIG. 7. A pair of balls 112 and 114 and mounted in plates 116 and 118 by being disposed in holes of diameter less than the diameter of the balls 112 and 114. The plate 118 may be in the form of a strip held in flexure by being riveted or otherwise secured to a backing plate 120. The balls 114 and 118 engage the opposite ends of the crystal 106 at the intersection of the longitudinal axis thereof with the end faces of the crystal. The crystal 106 is held between the balls 112 and 114 by the bias of the spring 118.

The crystal 106 is excited to vibrate in the extensional mode perpendicular to the longitudinal axis. The lowest such mode is the quadruple mode where the crystal moves outward along one diameter away from the longitudinal axis and inward along a perpendicular diameter toward the longitudinal axis. For such vibration the longitudinal axis defines a vibrational node, accordingly the support by means of the pedestal 110 (FIG. 6) or the balls 112 and 114 (FIG. 7) is especially suitable.

Instead of support by a separate pedestal, the pedestal may be formed by machining or grinding the crystal so as to have two posts 122 and 124 extending from the opposite ends thereof as shown in FIG. 8. The axis of the posts is the longitudinal axis of the crystal 126 as shown in FIG. 8. The balls 112 and 116 may engage the longitudinal axis at the ends of the posts 124 and 126 or one of the posts may serve as a pedestal.

In order to excite the quadruple mode of oscillation an electrode structure such as shown in FIG. 6 may be used. A cylindrical tube of insulating material 128 is disposed on the base plate 108 and two driver electrodes 130 and 132 and two pick-up or detector electrodes 134 and 136 are mounted on the tube 128 along the inner periphery thereof. These electrodes may be rectangular strips of a metal which are spaced opposite to the intersection of a diameter of the crystal 106, which is perpendicular to the longitudinal axis thereof, with the periphery of the crystal 106. The electrode pairs 130 and 132 and 134 and 136 are located above and below such a diameter which is disposed midway between the end faces of the crystal disc 106. The electrodes 132 and 134 may be part of an impulse driver such as the impulse driver 14 shown in FIG. 2. The electrode 134 and 136 may be part of a detector similar to the detector 18 shown in FIG. 2.

Another means for supporting and driving a cylindrical crystal 140 in a longitudinal mode of vibration is illustrated in FIGS. 9 and 10. The crystal 140 may be formed with a vane or rim 142 by machining or grinding the periphery thereof. This rim has steps 144 and 146 on opposite sides thereof. The steps are engaged by clamps provided by set screws 148, 150, 152, 154. These set screws are mounted in holders or a single holder 156 which rings the cylinder 140. Two or three sets of set screws 148, 150, 152 and 154 may be disposed 180° or 120° apart about the circumference of the crystal 140. The vane 142 is at the center or midway between the ends of the crystal cylinder and therefore enables the crystal cylinder to be supported at a vibrational node.

In order to drive the crystal, a single force pulse or a train of mechanical force pulses may be generated. An electromechanical transducer for translating an electrical impulse into such mechanical force pulses may be provided by a pair of spaced electrodes 158 and 160. These may be semi-circular in shape and spaced from the end of the crystal 140.

The pulses may be generated by a pulse generator having an avalanche diode 166 which is connected in series with the electrodes 158 and 160. (It will be noted that the crystal 140 itself is grounded through the set screws and the holder 156). Operating voltage from a source indicated as +V charges a capacitor 168 through a resistor 170, when a pulse is applied to the control electrode of a unijunction transistor 172. When the capacitor charges to the breakdown potential of the diode 166, the impulse is generated and applied to the electrode 158. This results in electrostatic generation of a force impulse which excites the crystal 140 into vibration in its longitudinal mode. The interval T between the pulses applied to the unijunction transistor 170 may be extremely long, say days apart. These pulses may be produced by a long-term timer, for example.

From the foregoing description it will be apparent that there has been provided improved methods of and apparatus for providing frequency standards and clocks of ultra-high stability. While preferred embodiments of such apparatus have been disclosed, it will be appreciated that variations and modifications within the scope of the invention will undoubtedly suggest themselves to those skilled in the art. Accordingly, the foregoing description should be taken merely as illustrative and not in any limiting sense.

What is claimed is:

1. The method of generating signals for use in frequency standards and clocks of high stability, said method comprising the steps of supporting a body consisting of a single crystal non-piezoelectric material having a mass of the order of kilograms for free vibration as a mechanical resonator at a frequency at which said body is resonant, exciting resonant, non-piezoelectric vibration of said body, and deriving said signals in response to said vibration.

2. The invention as set forth in claim 1 including the step of maintaining said body at a temperature of the order of a few degrees Kelvin.

3. The invention as set forth in claim 2 wherein said excited step is carried out during a period of time short as compared to the period during which said vibration is derived, and deriving step is carried out after the said exciting step during a period of free decay of said vibration.

4. The invention as set forth in claim 3 wherein said supporting step is carried out by supporting a plurality of said bodies, and said exciting step is carried out by exciting said bodies successively such that the excitation of a succeeding one of said plurality of bodies taking place when the vibration of a preceding one of said plurality of bodies decays to predetermined amplitude of vibration.

5. The invention as set forth in claim 2 wherein said supporting step is carried out by suspending said body.

6. The invention as set forth in claim 2 wherein said supporting step is carried out by supporting said body at a vibrational node.

7. The invention as set forth in claim 2 wherein said supporting step is carried out to support said body for vibration in an extensional mode, and said exciting step is carried out to excite said extensional mode of vibration.

8. The invention as set forth in claim 7 wherein said body is cylindrical in shape and said extensional mode is a longitudinal mode along the longitudinal axis of said cylindrical body, said exciting step being carried out by applying forces to one end of said body, and said deriving step is carried out by translating vibration of the opposite end of said body into said signals.

9. The invention as set forth in claim 7 wherein said body is cylindrical in shape and said extensional mode is the quadruple mode along diameters which are perpendicular to the longitudinal axis of said body and are perpendicular to each other, said exciting step is carried out by applying forces to said body to a region of the periphery thereof which is intersected by one end of one of said diameters and said deriving step is carried out by translating vibration of another region of the periphery of said body which is intersected by the opposite end of said one diameter and one of the ends of the diameter which is perpendicular to said one diameter.

10. The invention as set forth in claim 2 wherein said body is cylindrical and said supporting step is carried out by suspending said body midway between the ends thereof at a node of the vibration of said body in the longitudinal mode.

11. The invention as set forth in claim 10 wherein said body has a rim encompassing said body midway between the ends thereof, and said suspending step is carried out by engaging said body at said rim with a fixed member.

12. The invention as set forth in claim 2 wherein said body is cylindrical and said supporting step is carried out by placing one end of said body on a pedestal to enable said body to vibrate freely in the quadruple mode.

13. The invention as set forth in claim 2 wherein said body is cylindrical and said supporting step is carried out by suspending said body between a pair of balls biased toward each other into contact with the opposite ends of said body and disposed along the longitudinal axis of said body.

14. The invention as set forth in claim 2 wherein said deriving step comprises translating said vibration into electrical signals, and further comprising the step of measuring the frequency of said signals to provide an output in units of time.

15. Frequency standard apparatus which comprises a body consisting of single crystal material having a mass of the order of about a few kilograms, means for supporting said body for free mechanical vibration at a frequency at which said body is resonant, means for maintaining said body at a temperature of the order of about a few degree Kelvin, means for exciting said resonant, non-piezoelectric mechanical vibrations of said body, and means responsive to said resonant vibrations to provide output signals which are ultra stable in frequency.

16. The invention as set forth in claim 15 wherein said material is silicon.

17. The invention as set forth in claim 15 wherein said material is sapphire ($Al_2O_3$).

18. The invention as set forth in claim 15 wherein said supporting means is operative to maintain the Q of said body of a magnitude commensurate with the Q magnitude of said body when supported without restraint.

19. The invention as set forth in claim 18 wherein said supporting means is also operative to support said body for vibration in a low order extensional mode of vibration and at a position thereon where a node of said vibration is located.

20. The invention as set forth in claim 19 wherein said body is cylindrical in shape, said mode is the longitudinal mode of vibration and said node is located intermediate the ends of said body.

21. The invention as set forth in claim 20 wherein said supporting means comprises a strand member around said body, said body being balanced about said strand member.

22. The invention as set forth in claim 20 wherein said body has a rim around the center of the periphery thereof, said rim being integral with said body and forming steps on opposite sides thereof, and said supporting means comprising clamping means engaging said rim at said steps.

23. The invention as set forth in claim 19 wherein said body is cylindrical in shape, said mode is the quadruple mode of vibration and said mode is along the longitudinal axis of said body at the opposite ends thereof.

24. The invention as set forth in claim 23 wherein said supporting means comprises a pedestal, one of the opposite ends of said body being disposed upon said pedestal with said longitudinal axis and an axis through the center of said pedestal being in substantial alignment with each other.

25. The invention as set forth in claim 23 wherein said body has posts on the opposite ends thereof said posts being cylindrical, and the axes of said posts and said longitudinal axis being colinear, said supporting means being engageable with said posts.

26. The invention as set forth in claim 23 wherein said supporting means includes first and second balls, said first ball being in contact with said body at the intersection of said longitudinal axis and one end of said body, said second ball being in contact with said body at the intersection of said longitudinal axis and the opposite end of said body, and means for mounting said first ball and biasing said first ball toward said second ball so as to retain said body in supported relationship between said balls.

27. The invention as set forth in claim 15 wherein said exciting means includes means for electromechanically applying forces to said body in the direction of said resonant vibration thereof intermittently for periods of time very short as compared to the intrinsic decay time of said resonant vibrations after excitation.

28. The invention as set forth in claim 27 wherein said forces are bursts of oscillatory forces at a frequency equal approximately to one half the frequency of resonant vibration of said body.

29. The invention as set forth in claim 27 wherein said forces are in the form of a force pulse impulse.

30. The invention as set forth in claim 27 wherein said resonant vibration responsive means comprises transducer means spaced from and out of mechanical contact with said body for translating said vibrations into said output signals.

31. The invention as set forth in claim 30 wherein said body is cylindrical in shape and vibrates in the longitudinal mode, said electromechanical applying means and said transducer means being disposed adjacent opposite ends of said body.

32. The invention as set forth in claim 30 wherein said body is cylindrical in shape and vibrates in the quadruple mode, said electromechanical applying means and said transducer means being disposed adjacent to different regions of the periphery of said body which are diametrically opposite each other.

33. The invention as set forth in claim 30 wherein said apparatus comprises a plurality of said bodies each having electromechanical force applying means and transducer means independent thereto, means responsive to the amplitude of said output signals from each of said transducer means for operating said force applying means whereby to excite said bodies in successive order, a succeeding one of said plurality of bodies being excited when the amplitude of output signals corresponding to the vibration of the body preceding it in said order decays below a predetermined amplitude.

34. The invention as set forth in claim 30 further comprising means responsive to said output signals for measuring the frequency thereof in units of time.

35. The method of generating repetitive signals for use in frequency standards and clocks having frequency stability exceeding piezoelectric quartz clocks, which comprises supporting a body of single crystal, material for vibration as a mechanical resonator, exciting non-piezoelectric vibration of said body at a resonant frequency thereof, and deriving said signals in response to said vibration.

36. The invention as set forth in claim 35 wherein said material is selected from silicon and sapphire ($al_2O_3$).

37. The invention as set forth in claim 35 wherein said exciting step is carried out intermittently at intervals of time commensurate with the period of free decay of said vibration.

38. Apparatus for use in a frequency standard or clock having frequency stability higher than piezoelectric quartz clocks or standards, which comprises a mechanical resonator having a body consisting of single crystal material, means for exciting resonant, non-piezoelectric material vibration of said body, and means responsive to said vibration for providing repetitive output signals of said frequency stability.

39. The invention as set forth in claim 38 wherein said material is selected from silicon and sapphire ($Al_2O_3$).

40. The invention as set forth in claim 38 wherein said exciting means includes means for exciting said body intermittently at intervals of time commensurate with the period of free decay of said vibration.

* * * * *

UNITED STATES PATENT AND TRADEMARK OFFICE

CERTIFICATE OF CORRECTION

PATENT NO. : 4,242,611
DATED : December 30, 1980
INVENTOR(S) : David H. Douglass It is certified that error appears in the above—identified patent and that said Letters Patent is hereby corrected as shown below:

Column 1, after title of invention insert

-- The Government has rights in this invention pursuant to grant PHY-72-04755 awarded by the National Science Foundation --.

Signed and Sealed this

*Seventh* Day of *April 1981*

[SEAL]

*Attest:*

RENE D. TEGTMEYER

*Attesting Officer* *Acting Commissioner of Patents and Trademarks*